(12) United States Patent
Okada

(10) Patent No.: US 7,365,573 B2
(45) Date of Patent: Apr. 29, 2008

(54) MIXED-VOLTAGE INTERFACE AND SEMICONDUCTOR INTEGRATED CIRCUIT

(75) Inventor: Atsuhiko Okada, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 142 days.

(21) Appl. No.: 11/349,909

(22) Filed: Feb. 9, 2006

(65) Prior Publication Data
US 2006/0198227 A1    Sep. 7, 2006

(30) Foreign Application Priority Data
Feb. 25, 2005    (JP)    ............... 2005-050014

(51) Int. Cl.
*H03K 19/0175*    (2006.01)
*G06F 13/12*    (2006.01)
(52) U.S. Cl. .................... 326/86; 326/62; 326/80; 710/71
(58) Field of Classification Search ............ 326/81, 326/83, 86, 58
See application file for complete search history.

(56) References Cited

U.S. PATENT DOCUMENTS 5,880,602 A * 3/1999 Kaminaga et al. ............ 326/81
6,339,343 B1 * 1/2002 Kim et al. ...................... 326/83
6,411,122 B1 * 6/2002 Mughal et al. ............... 326/30
6,943,587 B2 * 9/2005 Joshi et al. .................. 326/80
2004/0036494 A1 * 2/2004 Mak et al. ................... 324/763

FOREIGN PATENT DOCUMENTS

JP    5-299598    11/1993

* cited by examiner

*Primary Examiner*—Vibol Tan
(74) *Attorney, Agent, or Firm*—Nixon Peabody LLP; Donald R. Studebaker (57) ABSTRACT

A mixed-voltage interface transfers signals serially between a pair of circuit blocks operating at different voltage levels in a semiconductor integrated circuit. Control, address, and data signals are multiplexed onto a common signal line. The number of necessary signal lines is thereby greatly reduced, as compared with parallel signal transfer, and a separate electrostatic discharge protection circuit can be provided for each signal line without the need to devote excessive space to protection circuitry.

7 Claims, 11 Drawing Sheets

MIXED-VOLTAGE INTERFACE AND SEMICONDUCTOR INTEGRATED CIRCUIT

BACKGROUND OF THE INVENTION

1. Field of the Invention

The present invention relates to a mixed-voltage semiconductor integrated circuit, and in particular to the transfer of signals between circuit blocks operating at different voltage levels.

2. Description of the Related Art

Large-scale integrated circuits are at risk of two general types of internal electrostatic destruction (ESD). One type, which was formerly the main type, damages pn junctions by creating parasitic bipolar transistors and parasitic diodes. The other type, which has become more frequent as mixed-voltage designs have become increasingly common, damages the gate oxide films of transistors in the receiving buffers in mixed-voltage interfaces.

ESD protection can be provided by, for example, simple diode circuits that shunt current from input and output signal lines to the power supply or ground when the voltages on the signal lines become abnormally high or low. ESD protection circuits of this type are normally provided for all external input and output signal terminals. More robust ESD protection circuits that can shunt current between power-supply and ground terminals are also commonly present. Electrostatic discharges at the external power or ground terminals of a mixed-voltage integrated circuit, however, can produce surges that reach the buffers that transfer signals between different voltage domains in the core area before the power-to-ground protection circuits have time to operate. This is especially true in devices with highly conductive metal wiring and salicided gate electrode lines.

To improve the ESD immunity of mixed-voltage circuits, non-salicided structures are sometimes used in active regions between gate contacts, but the resulting added resistive component delays response to surges, and may actually promote internal destruction.

Figure 1:
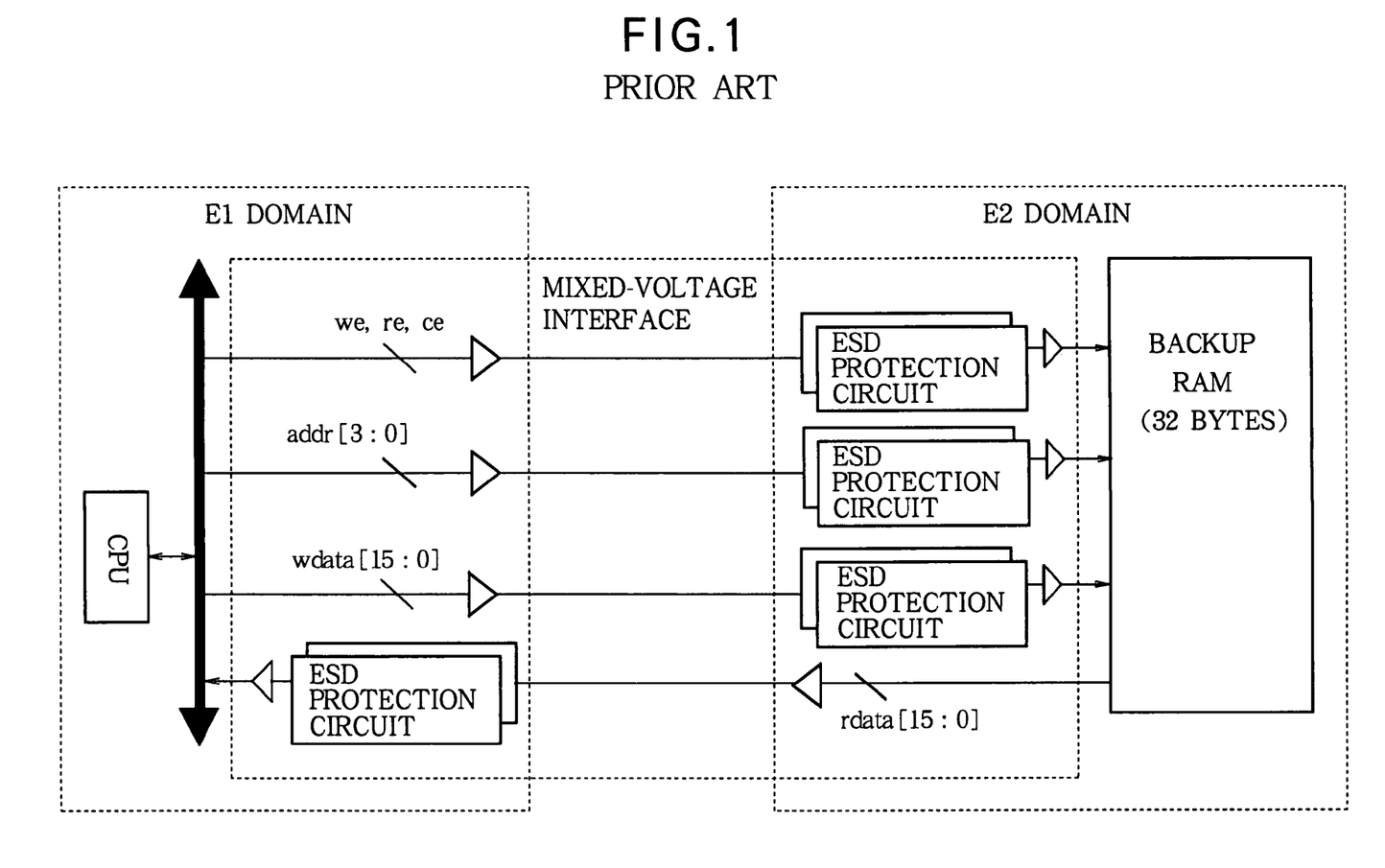
FIG. 1 is a schematic diagram illustrating a conventional mixed-voltage interface.
Figure 2:
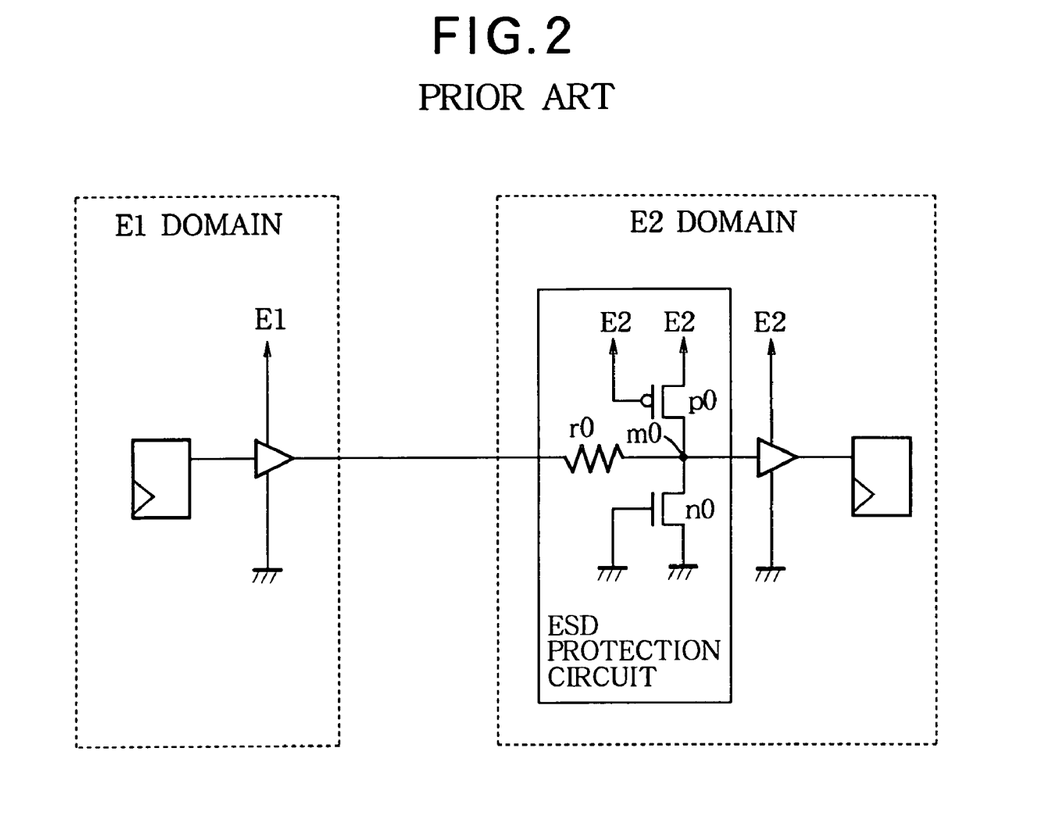
FIG. 2 is a circuit diagram illustrating one of the ESD protection circuits in FIG. 1.

The best type of ESD protection for an internal mixed-voltage interface is to provide a separate ESD protection circuit on each interface signal line, as illustrated in FIG. 1. The device in this drawing has one core domain, including a central processing unit (CPU), that operates at a comparatively high voltage level (E1) and another core domain, including a random-access memory (RAM), that operates at a lower voltage level (E2). The E1 power supply can be switched off to save power while the E2 power supply remains switched on to retain data. A total of thirty-nine signal lines, including one write enable (we) signal line, one read enable (re) signal line, one chip enable (ce) signal line, four address (adr) signal lines, sixteen write data (wdata) signal lines, and sixteen read data (rdata) signal lines, are used to transfer data over sixteen-bit-wide data paths between the two voltage domains. Each one of the thirty-nine signal lines has a separate ESD protection circuit. FIG. 2 illustrates the structure of an ESD protection circuit in the E2 domain; the structure includes transistors p0 and n0 that function as diodes, and a resistor r0.

A problem with this type of mixed-voltage interface is that the area occupied by the ESD protection circuits increases in proportion to the number of signal lines that cross boundaries between different voltage blocks. Each ESD protection circuit occupies a space of about two thousand to three thousand square micrometers (2000-3000 $\mu m^2$), so the total area occupied by the ESD protection circuits in FIG. 1, for example, is on the order of 0.12 square millimeter (0.12 $mm^2$=0.003 $mm^2$×40). This is a not insignificant fraction of the total area of a large-scale integrated circuit chip.

Integrated circuits in which the number of ESD protection circuits is reduced by providing a protection circuit between each power supply terminal and a common node in place of a protection circuit for each internal signal line are also known (see, for example, Japanese Patent Application Publication No. H5-299598), but the protection afforded by this scheme is less robust than in FIG. 1.

SUMMARY OF THE INVENTION

An object of the present invention is to reduce the amount of space occupied by ESD protection circuits in a mixed-voltage interface in a semiconductor integrated circuit.

A mixed-voltage interface according to the present invention transfers data between a pair of circuit blocks operating at different voltage levels by serial data transfer, preferably on a single signal line in each direction, instead of by parallel transfer on multiple signal lines.

This scheme greatly reduces the number of required interface signal lines. The number of required ESD protection circuits is equally reduced, and the area occupied by the ESD protection circuitry is lessened accordingly.

The invention also provides a semiconductor integrated circuit including the invented mixed-voltage interface.

DETAILED DESCRIPTION OF THE INVENTION

Embodiments of the invention will now be described with reference to the attached drawings, in which like elements are indicated by like reference characters.

First Embodiment

Figure 3:
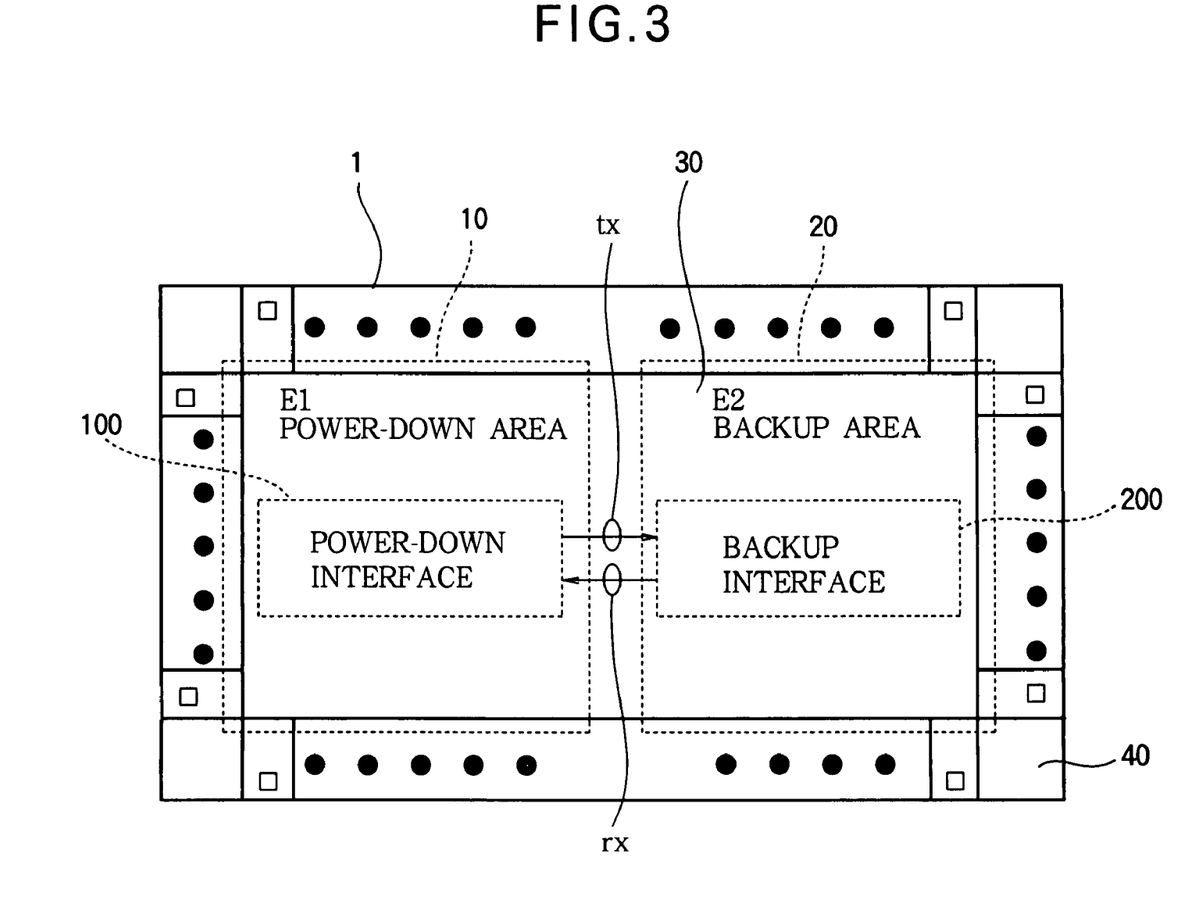
FIG. 3 is a schematic plan view of a semiconductor integrated circuit incorporating a first embodiment of the invention.

Referring to FIG. 3, the first embodiment is implemented in a monolithic large-scale integrated (LSI) circuit chip 1 having a power-down area 10 and a backup area 20 that constitute mainly the core area 30 of the chip, and an input/output (I/O) area 40 surrounding the core area 30. The I/O area 40, which partly overlaps the power-down area 10 and backup area 20, includes input and output buffer cells for external signals and power cells that supply power to the core area 30. In the following description, the power supplied to the power-down area 10 will be denoted E1 and the power supplied to the backup area 20 will be denoted E2. The two power supplies E1, E2 have different voltage levels. The power-down area 10 and backup area 20 are interconnected through respective interfaces 100, 200.

E1 is a higher-voltage power supply than E2, meaning that the difference between the E1 power-supply and ground potentials is greater than the difference between the E2 power-supply and ground potentials. The E1 and E2 ground potentials may be the same.

To reduce system power consumption, this chip 1 has a power-down mode. On entry to the power-down mode, data held in the power-down area 10 are transferred via the mixed-voltage interface to the backup area 20 and saved there. The power-down area 10 then is shut down and its power supply E1 is switched off to eliminate quiescent current consumption, while the power supply E2 of the backup area 20 is left on. During the power-down mode, while the power-down area 10 remains shut down the backup area 20 continues to retain the data transferred from the power-down area 10. On return from the power-down mode to the active mode, the E1 power supply is switched on again, and the retained data are restored from the backup area 20 via the mixed-voltage interface to the power-down area 10.

To save the data in the backup area 20, the interface 100 in the power-down area 10 sends a serial data signal (tx) to the interface 200 in the backup area 20. To restore the saved data from the backup area 20 to the power-down area 10, the interface 200 in the backup area 20 sends a serial data signal (rx) to the interface 100 in the power-down area 10. Just two information signal lines link the power-down area 10 with the backup area 20, one signal line carrying serial data signal tx, the other signal line carrying serial data signal rx. These signal lines and the interfaces 100, 200 constitute the mixed-voltage interface in the first embodiment.

Figure 4:
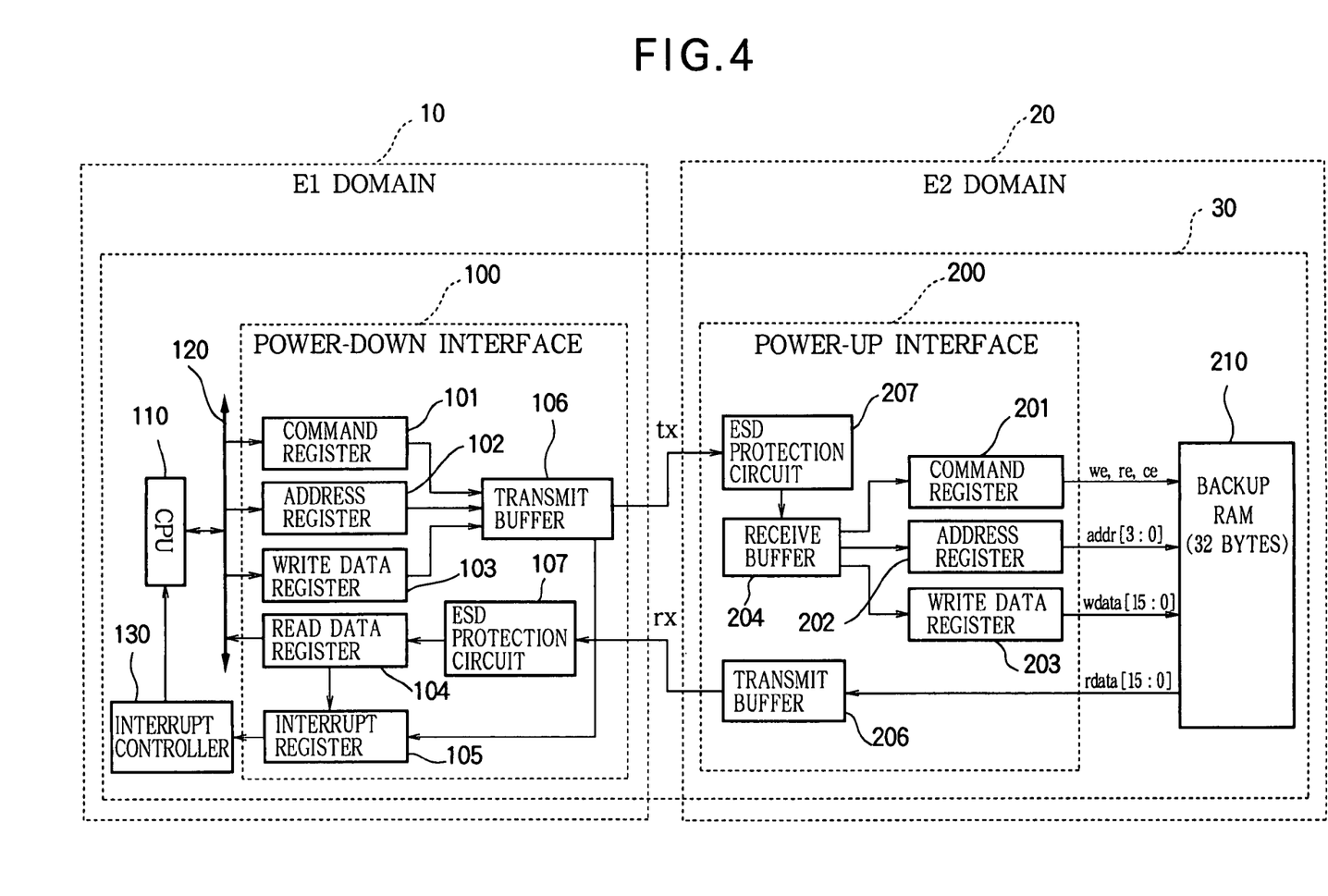
FIG. 4 is a block diagram of the core area in the integrated circuit in FIG. 3.

Referring to FIG. 4, the power-down area 10 in the core area 30 includes the power-down interface 100, a CPU 110, a CPU bus 120, and an interrupt controller 130. The backup area 20 in the core area 30 includes the backup interface 200 and a backup RAM 210 that stores data transferred from the power-down area 10.

The interface 100 in the power-down area 10 includes a command register 101, an address register 102, a write data register 103, a read data register 104, an interrupt register 105, a transmit buffer or transmitter 106, and an ESD protection circuit 107. The ESD protection circuit 107 is disposed on the rx signal line near the input of the read data register 104.

The command register 101, address register 102, and write data register 103 function as a first converter by receiving command signals, address signals, and write data signals in parallel form from the CPU 110 via the CPU bus 120, storing the received signals, and sending the stored signals to the transmit buffer 106 in serial form. The transmit buffer 106 combines the command signals, address signals, and write data signals in a predetermined order into a serial data signal tx, transmits the serial data signal tx to the backup area 20, and then sets a bit in the interrupt register 105. The read data register 104 receives the other serial data signal rx from the backup area 20, converts the received serial data to parallel data as output from the backup RAM 210, sets a bit in the interrupt register 105, and subsequently transfers the parallel read data to the CPU 110 via the CPU bus 120. The bits set in the interrupt register 105 activate the interrupt controller 130, which generates CPU interrupts that result in, for example, the transfer of more write data, address signals, and command signals to the power-down interface 100, or the reading of the data stored in the read data register 104.

The interface 200 in the backup area 20 includes a command register 201, an address register 202, a write data register 203, a receive buffer or receiver 204, a transmit buffer 206, and an ESD protection circuit 207. The ESD protection circuit 207 is disposed on the tx signal line near the input of the receive buffer 204.

The receive buffer 204 receives the serial data signal tx sent from the power-down area 10. The command register 201, address register 202, and write data register 203 function as a second converter by converting the received serial data to parallel command signals, address signals, and write data signals, and transferring the converted command, address, and write data signals in parallel form to the backup RAM 210. The transmit buffer 206 receives sixteen-bit parallel read data from the backup RAM 210 and sends the data to the power-down area 10 in serial form as the serial data signal rx.

Figure 5:
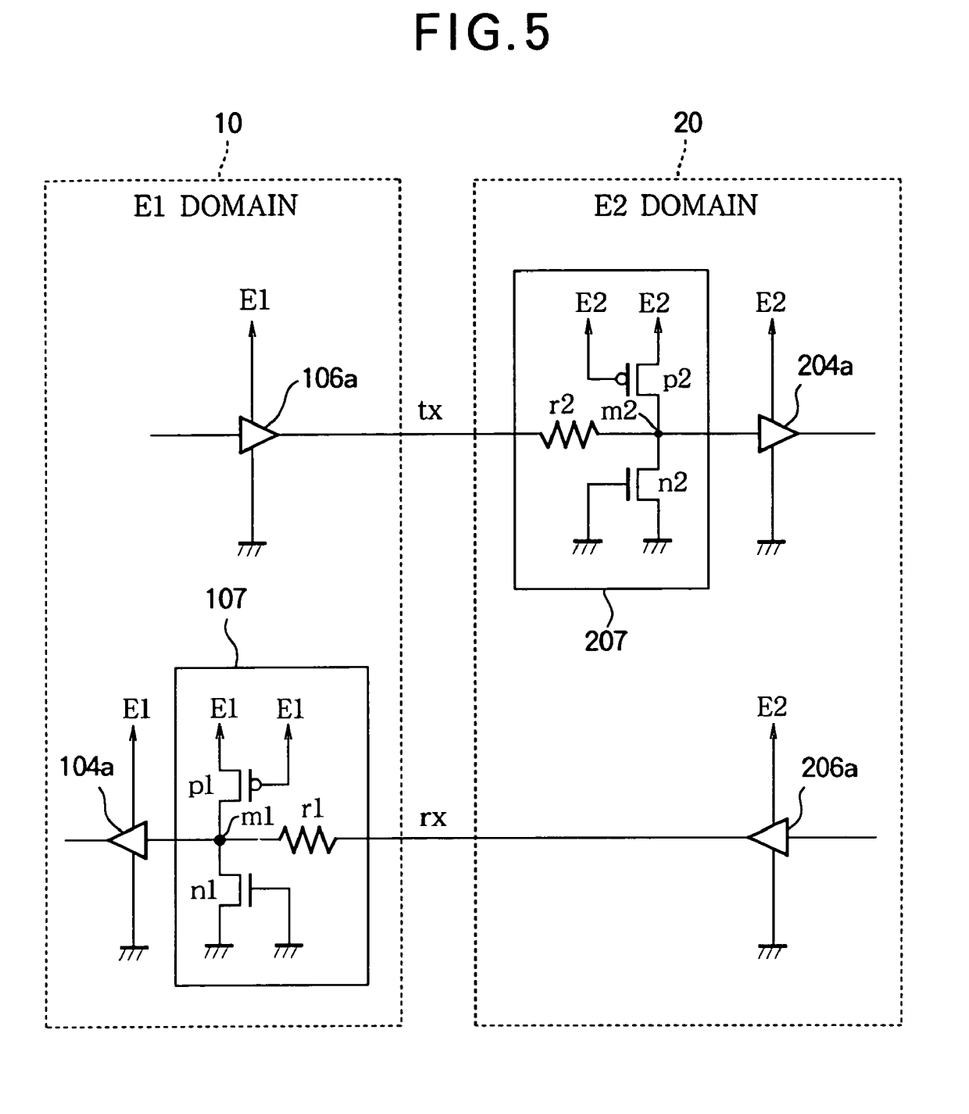
FIG. 5 is a circuit diagram illustrating the ESD protection circuits in FIG. 4.

Referring to FIG. 5, the ESD protection circuit 107 in the power-down interface 100 has a p-channel metal-oxide-semiconductor field-effect transistor (referred to below as a PMOS transistor) p1, an n-channel metal-oxide-semiconductor field-effect transistor (NMOS transistor) n1, and a resistor r1, and the ESD protection circuit 207 in the backup interface 200 has a PMOS transistor p2, an NMOS transistor n2, and a resistor r2.

The read data register 104, transmit buffer 106, receive buffer 204, and transmit buffer 206 include an input buffer 104a, an output buffer 106a, an input buffer 204a, and an output buffer 206a, respectively.

Output buffer 106a operates at the E1 power-supply and ground potentials; input buffer 204a operates at the E2 power-supply and ground potentials. In ESD protection circuit 207, PMOS transistor p2 has its source and gate electrodes connected to the E2 power-supply potential and its drain electrode connected to a node m2; NMOS transistor n2 has its source and gate electrodes connected to the E2 ground potential and its drain electrode connected to node m2. Serial data signal tx is transmitted from the output buffer 106a in the transmit buffer 106 to the input buffer 204a in the receive buffer 204 via resistor r2 and node m2. PMOS transistor p2 and NMOS transistor n2 function as diodes linking node m2 to the E2 power supply and ground, respectively. If the E1 power-supply potential exceeds the E2 power-supply potential by more than the threshold voltage of PMOS transistor p2, then PMOS transistor p2 also functions as a level converter by converting the high logic level of serial data signal tx from the E1 power-supply potential to a level closer to the E2 power-supply potential.

Similarly, input buffer 104a operates at the E1 power-supply and ground potentials, and output buffer 206a E2 power-supply and ground potentials. In ESD protection circuit 107, PMOS transistor p1 has its source and gate electrodes connected to the E1 power-supply potential and its drain electrode connected to a node m1; NMOS transistor n1 has its source and gate electrodes connected to the E1 ground potential and its drain electrode connected to node m1. Serial data signal rx is supplied from the output buffer 206a in the transmit buffer 206 to the input buffer 104a in the read data register 104 via resistor r1 and node m1. PMOS transistor p1 and NMOS transistor n1 function as diodes linking node m1 to the E1 power supply and ground, respectively.

Data transfers between the power-down area 10 and backup area 20 are carried out by a backup routine and a recovery routine executed by the CPU 110.

Figure 6:
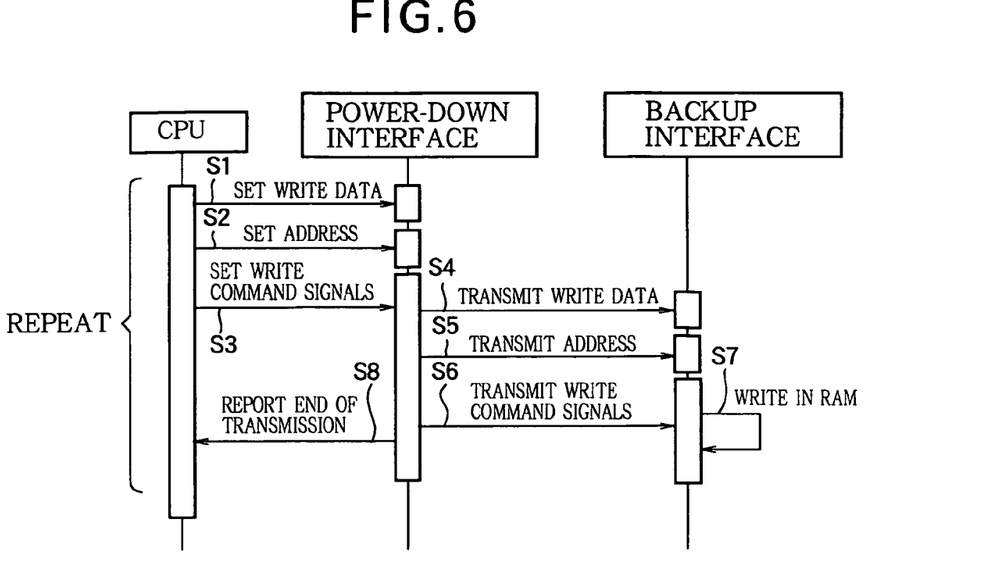
FIG. 6 illustrates a data transfer sequence executed by a backup routine.

When the power-down area 10 enters the power-down mode, the backup routine is executed to transfer data held in the power-down area 10 via interface 100 to the backup interface 200, and to save the transferred data in the backup RAM 210. Referring to FIG. 6, the CPU 110 first sets data to be backed up as write data in the write data register 103 in the power-down interface 100 in step S1, then sets a write address (at which the write data are to be saved in the backup RAM 210) in the address register 102 in step S2, and finally sets write command signals in the command register 101 in step S3.

In steps S4, S5, and S6, when the write command signals have been set in the command register 101, the power-down interface 100 sends a serial data signal tx including the write data, the write address, and the write commands in bit-serial form from its transmit buffer 106 to the backup interface 200 in the backup area 20.

In step S7, the backup interface 200 receives the serial data signal tx from the power-down interface 100, and the write data register 203, the address register 202, and the command register 201 convert the received serial data to parallel write data (backup data), write address signals, and write command signals, which are set in the write data register 203, the address register 202, and the command register 201, respectively.

When the write command signals have been set in the command register 201, the command register 201 supplies active write enable (we) and chip enable (ce) signals to the backup RAM 210, and the backup RAM 210 stores the write data set in the write data register 203 (wdata[15:0], sixteen bits) at the address given by the write address signals (addr[3:0], four bits) in the address register 202.

In step S8, when all bits of the serial data signal tx, including the write data, the write address, and the write command signals, have been transferred, the power-down interface 100 notifies the CPU 110 via the interrupt register 105 and interrupt controller 130 that the transmit buffer 106 has transferred the serial data signal tx to the backup interface 200. On receiving this notification, the CPU 110 starts executing the next data transfer sequence by repeating steps S1 to S8.

When the data transfer sequence in steps S1 to S8 has been repeated a predetermined number of times and all data held in the power-down area 10 have been transferred to the backup area 20 and saved there, the backup routine ends. In the first embodiment, thirty-two bytes of data are backed up in sixteen repetitions of the data transfer sequence, each repetition backing up sixteen bits.

On completion of the backup routine, the power supply E1 of the power-down area 10 is switched off.

Figure 7:
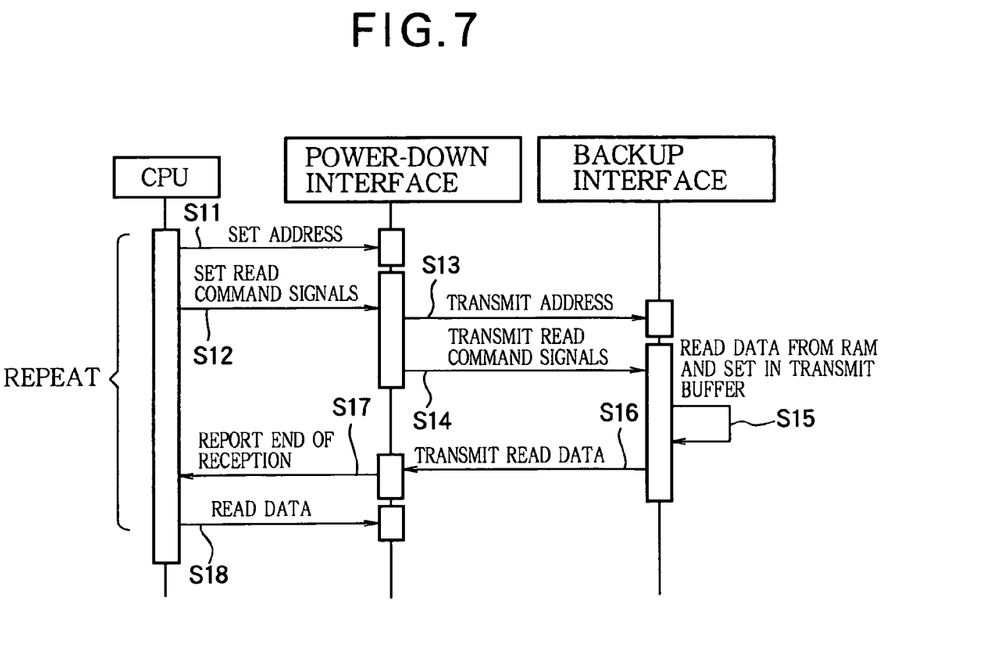
FIG. 7 illustrates a data transfer sequence executed by a recovery routine.

When the power supply E1 of the power-down area 10 is switched on again and the power-down area 10 returns from the power-down mode to the active mode, the CPU 110 executes the recovery routine to restore the data saved in the backup RAM 210 to the power-down area 10 via the interfaces 100, 200.

Referring to FIG. 7, when the E1 power supply is switched on again, the CPU 110 first sets a read address (at which saved data are to be read from the backup RAM 210) in the address register 102 in the power-down interface 100 in step S11, and next sets read command signals in the command register 101 in step S12.

In steps S13 and S14, when the read command signals have been set in the command register 101, the power-down interface 100 sends a serial data signal tx including the read address and read command signals in bit-serial form from the transmit buffer 106 to the backup interface 200.

In step S15, the backup interface 200 receives the serial data signal tx from the power-down interface 100, and the address register 202 and command register 201 convert the received serial data to read address signals and read command signals.

When the read command signals have been set in the command register 201, the command register 201 supplies read enable (re) and chip enable (ce) signals to the backup RAM 210. The backup RAM 210 outputs data (rdata[15:0], sixteen bits) read from the address given by the read address signals (addr[3:0]) in the address register 202. The read data (rdata[15:0]) are set in the transmit buffer 206.

In step S16, when the read data have been set in the transmit buffer 206, the transmit buffer 206 sends a serial data signal (rx) including the read data (backup data) to the power-down area 10.

In step S17, the power-down interface 100 receives the serial data signal (rx) from the backup area 20, and the read data register 104 converts the received serial data to parallel data.

When all bits of the serial data signal (rx) have been received, the power-down interface 100 notifies the CPU 110 via the interrupt register 105 and interrupt controller 130 that it has received the serial data signal (rx) from the backup interface 200.

In step S18, on receiving this notification, the CPU 110 restores the read data (backup data) from the read data register 104 in the power-down interface 100 to its own internal registers and other registers (as necessary) in the power-down area 10.

After restoring the read data from the read data register 104, the CPU 110 starts executing the next data transfer sequence by repeating steps S11 to S18. When the data transfer sequence in steps S11 to S18 has been repeated a predetermined number of times and all saved data have been restored from the backup area 20 to the power-down area 10, the recovery routine ends.

As described above, in the first embodiment, parallel data representing a plurality of signals are converted to serial data, the power-down area 10 sends the serial data signal (tx) to the backup area 20 on one signal line, and the backup area 20 sends a serial data signal (rx) to the power-down area 10 on another signal line, so only two information signal lines have to be have to be protected from electrostatic destruction and the area occupied by the ESD protection circuitry is correspondingly small. More specifically, the thirty-nine ESD protection circuits that were required in the prior art are reduced to just two ESD protection circuits in the first embodiment.

Second Embodiment

Figure 8:
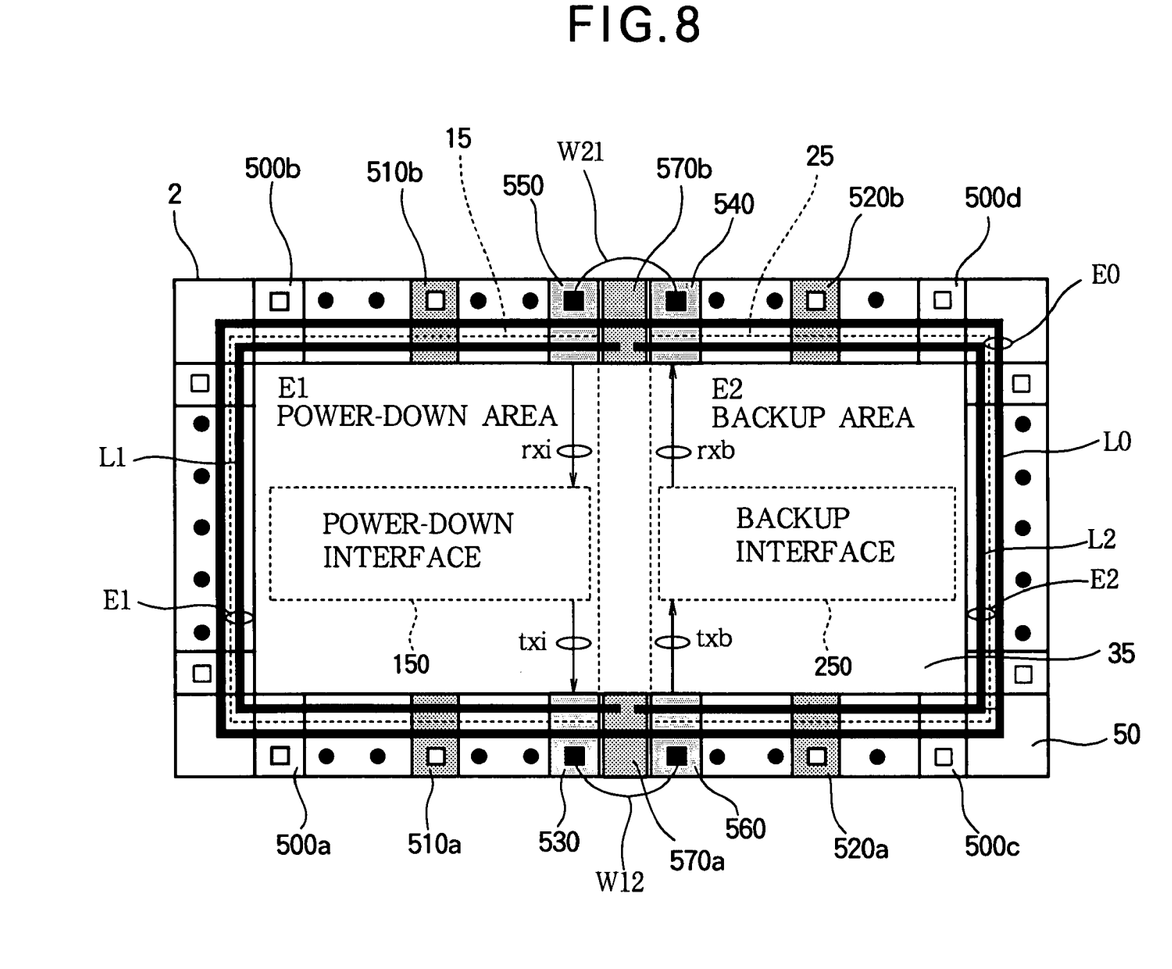
FIG. 8 is a schematic plan view of a semiconductor integrated circuit incorporating a second embodiment of the invention.

Referring to FIG. 8, the second embodiment is implemented in an LSI chip 2 having a power-down area 15 and a backup area 25 that constitute mainly the core area 35 of the chip, and an I/O area 50 surrounding the core area 35, partly overlapping the power-down area 15 and backup area 25. In the core area 35, the power-down area 15 includes a power-down interface 150 and the backup area 25 includes a backup interface 250.

The LSI chip 2 in the second embodiment operates on three power supplies E0, E1, E2 with different voltage levels. E0 power is supplied to the I/O area 50 through four I/O power cells 500a, 500b, 500c, 500d and an I/O power line L0, which are located in the I/O area 50. E1 power is supplied to the power-down area 15 and part of the I/O area 50 through a pair of first core power cells 510a, 510b and a first core power line L1, also located in the I/O area 50. E2 power is supplied to the backup area 25 and part of the I/O area 50 through a pair of second core power cells 520a, 520b and a second core power line L2, likewise located in the I/O area 50. The I/O area 50 also includes a pair of output buffer cells 530, 540, a pair of input buffer cells 550, 560, a pair of power isolation cells 570a, 570b, and other cells not explicitly identified in the drawing. The power isolation cells 570a, 570b isolate the part of the I/O area 50 powered by the E1 power supply from the part powered by the E2 power supply.

In the second embodiment, instead of being interconnected directly, the power-down interface 150 and backup interface 250 exchange serial data signals (txi, txb, rxb, rxi) through the buffer cells 530, 540, 550, 560 and a pair of external bonding wires W12, W21. Bonding wire W12 connects the first output buffer cell 530 to the second input buffer cell 560; bonding wire W21 connects the second output buffer cell 540 to the first input buffer cell 550. The mixed-voltage interface in the second embodiment includes these bonding wires and the power-down interface 150, backup interface 250, output buffer cells 530, 540, and input buffer cells 550, 560.

Figure 9:
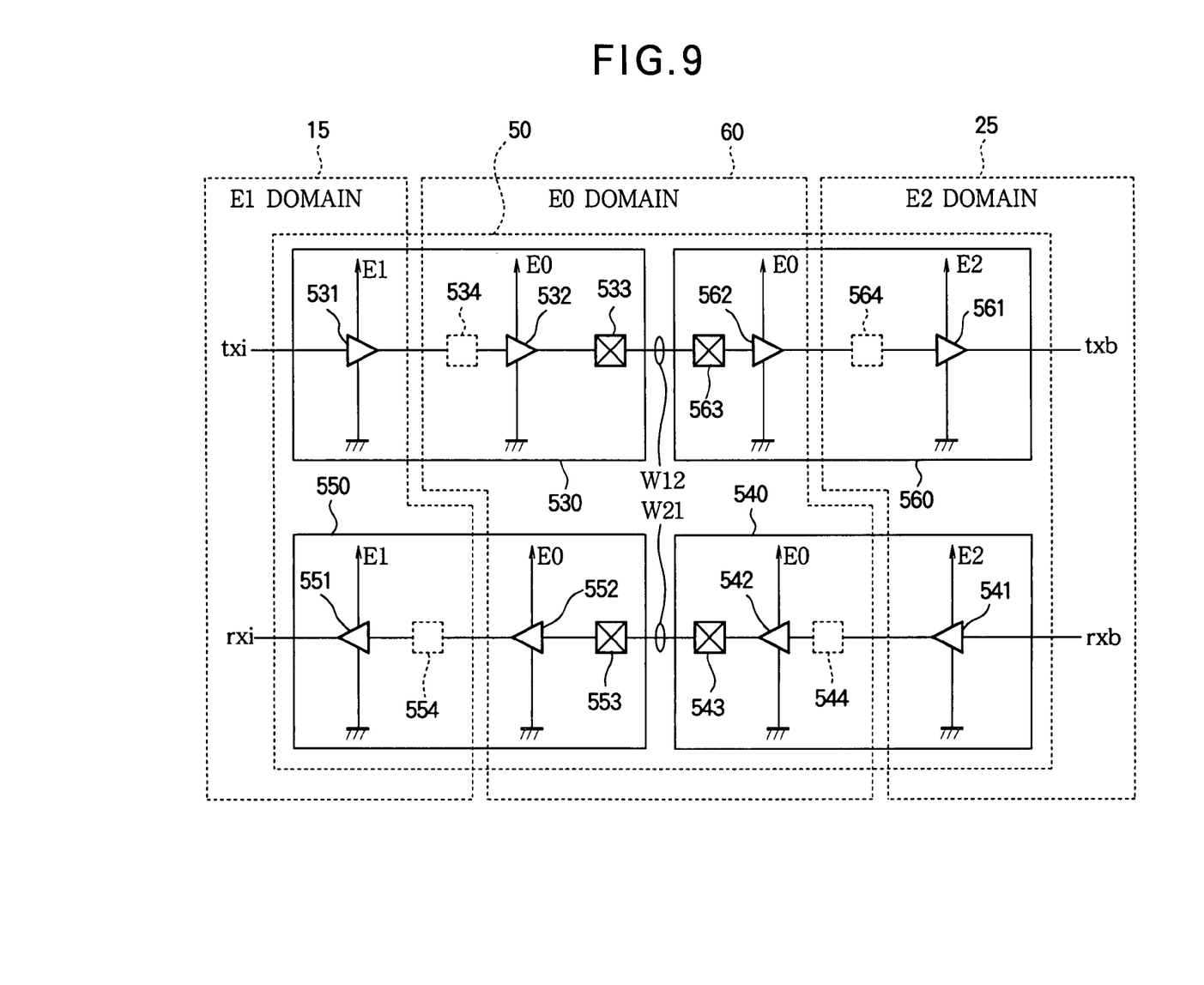
FIG. 9 is a schematic circuit diagram illustrating the input and output buffers in FIG. 10.

Referring to FIG. 9, the first output buffer cell 530 and first input buffer cell 550 are disposed partly within the E1 voltage domain (in the power-down area 15) and partly within the E0 voltage domain 60 of the I/O area 50; the second output buffer cell 540 and second input buffer cell 560 are disposed partly within the E2 voltage domain (in the backup area 25) and partly within the E0 voltage domain 60.

The first output buffer cell 530 includes a first output buffer stage 531, a second output buffer stage 532, and an I/O pad 533; the second output buffer cell 540 includes a first output buffer stage 541, a second output buffer stage 542, and an I/O pad 543; the first input buffer cell 550 includes a second input buffer stage 551, a first input buffer stage 552, and an I/O pad 553; the second input buffer cell 560 includes a second input buffer stage 561, a first input buffer stage 562, and an I/O pad 563. Bonding wire W12 is bonded to I/O pads 533 and 563; bonding wire W21 is bonded to I/O pads 543 and 553.

In the first output buffer cell 530, the first output buffer stage 531 operates at the E1 power-supply and ground potentials; the second output buffer stage 532 operates at the E0 power-supply and ground potentials.

In the second output buffer cell 540, the first output buffer stage 541 operates at the E2 power-supply and ground potentials; the second output buffer stage 542 operates at the E0 power-supply and ground potentials.

In the first input buffer cell 550, the first input buffer stage 552 operates at the E0 power-supply and ground potentials; the second input buffer stage 551 operates at the E1 power-supply and ground potentials.

In the second input buffer cell 560, the first input buffer stage 562 operates at the E0 power-supply and ground potentials; the second input buffer stage 561 operates at the E2 power-supply and ground potentials.

Accordingly, the first output buffer stage 531 and second input buffer stage 551 operate at the power-supply and ground potentials of the power-down area 15; the first output buffer stage 541 and second input buffer stage 561 operate at the power-supply and ground potentials of the backup area 25; and the second output buffer stage 532, first input buffer stage 562, second output buffer stage 542, and first input buffer stage 552 operate at the power-supply and ground potentials of the E0 voltage domain 60.

The core power cells 510a, 510b, 520a, 520b include protection circuits (transistors, not shown in the drawings) that can shunt current between the different power supplies to maintain proper voltage level relationships. The first core power cells 510a, 510b include protection circuits for shunting current between the power supply E1 of the power-down area 15 and the power supply E0 of the E0 voltage domain 60. The second core power cells 520a, 520b include protection circuits fur shunting current between the power supply E2 of the backup area 25 and the power supply E0 of the E0 voltage domain 60. These protection circuits operate when one of the two power supplies concerned experiences an electrostatic discharge surge or other abnormal event.

These protection circuits also protect the signal lines that cross voltage boundaries in FIG. 9. Specifically, the protection circuits in the first core power cells 510a, 510b function as an equivalent ESD protection circuit 534 to protect the signal line between the first and second output buffer stages 531, 532 in the first output buffer cell 530, and as an equivalent ESD protection circuit 554 to protect the signal line between the first and second input buffer stages 552, 551 in the first input buffer cell 550. The protection circuits in the second core power cells 520a, 520b function as an equivalent ESD protection circuit 544 to protect the signal line between the first and second output buffer stages 541, 542 in the second output buffer cell 540, and as an equivalent ESD protection circuit 564 to protect the signal line between the first and second input buffer stages 562, 561 in the second input buffer cell 560.

Figure 10:
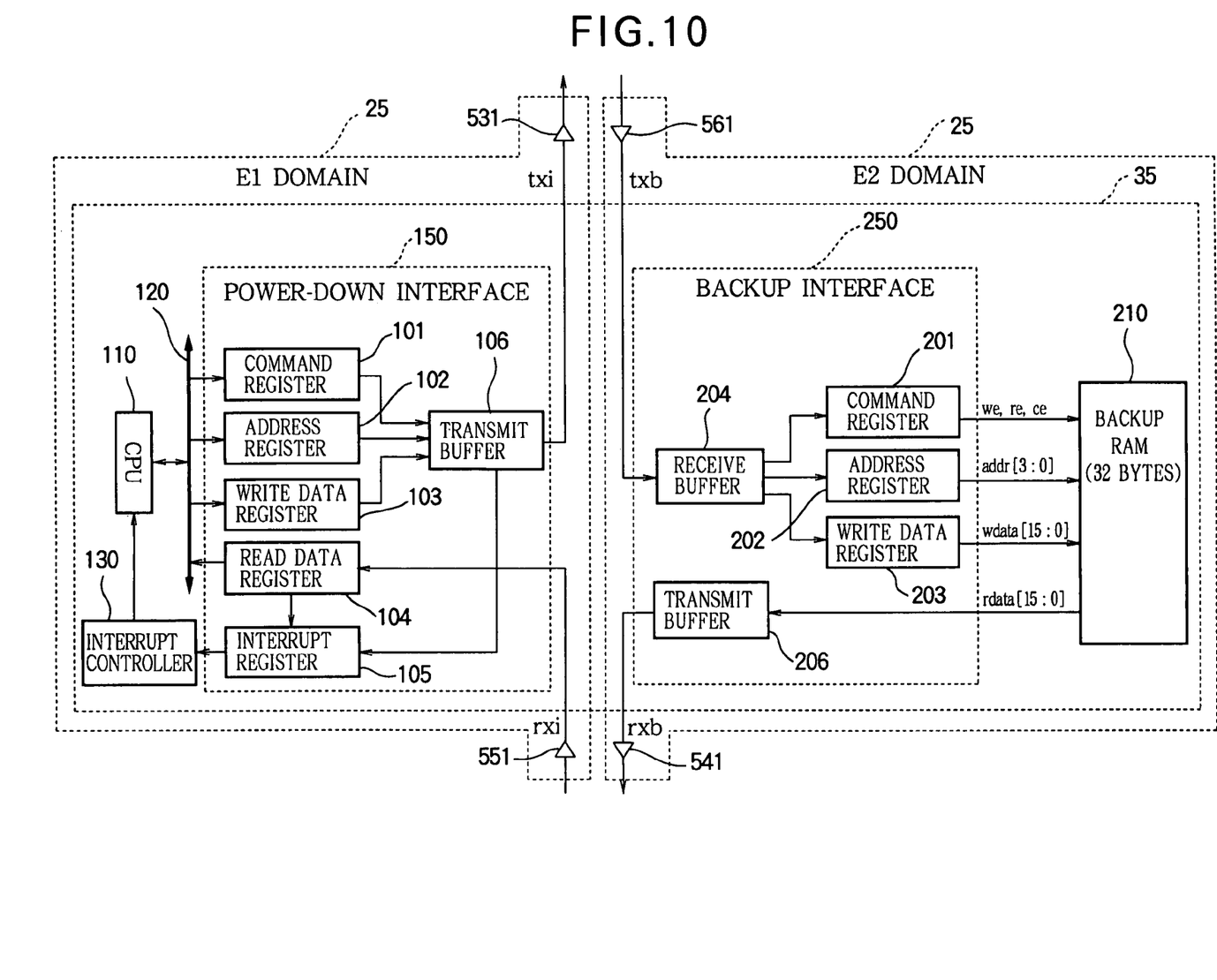
FIG. 10 is a block diagram of the core area in the integrated circuit in FIG. 8.

Referring to FIG. 10, the power-down area 15 and backup area 25 in the core area 35 in the second embodiment differ from the power-down area 10 and the backup area 20 in the core area 30 in the first embodiment in regard to the structure of the power-down interface 150 and backup interface 250. These interfaces 150, 250 differ from the power-down and backup interfaces 100, 200 in the first embodiment by omitting the ESD protection circuits 107, 207 shown in FIG. 4. Another difference is that in the second embodiment, the transmit buffer 106 sends serial data signal txi to the first output buffer stage 531, the transmit buffer 206 sends serial data signal rxb to the first output buffer stage 541, the receive buffer 204 receives serial data signal rxi from the second input buffer stage 551, and the receive buffer 204 receives serial data signal txi from the second input buffer stage 561, as shown in FIG. 10. The other elements in FIG. 10 are identical to the corresponding elements in FIG. 4.

To reduce system power consumption, the LSI chip 2 has a power-down mode similar to the power-down mode in the first embodiment, in which the power-down area 15 remains shut down while the backup area 25 continues to hold backup data transferred from the power-down area 15. On entry to and exit from the power-down mode, data transfer sequences are executed by the same backup and recovery routines as in the first embodiment (FIGS. 6 and 7).

To save data in the power-down area 15, the interface 150 in the power-down area 15 sends a serial data signal txi through the first output buffer cell 530 and bonding wire W12 to the second input buffer cell 560 in the I/O area 50, and the second input buffer cell 560 sends an equivalent serial data signal txb to the interface 250 in the backup area 25. To restore the saved data from the backup area 25 to the power-down area 15, the interface 250 in the backup area 25 sends a serial data signal rxb through the second output buffer cell 540 and bonding wire W21 to the first input buffer cell 550 in the I/O area 50, and the first input buffer cell 550 sends an equivalent serial data signal rxi to the interface 150 in the power-down area 15.

More specifically, the serial signal txi transmitted by the transmit buffer 106 in the power-down interface 150 at the E1 power-supply and ground levels is input to the first output buffer stage 531 in the first output buffer cell 530. The first output buffer stage 531 sends an identical serial signal at the E1 levels to the second output buffer stage 532, which outputs an equivalent serial signal at the E0 levels at I/O pad 533. This signal is carried through bonding wire W12 to the I/O pad 563 in the second input buffer cell 560 and received by the first input buffer stage 562, which sends an identical signal at the E0 levels to the second input buffer stage 561. The second input buffer stage 561 then sends an equivalent serial signal txb at the E2 levels to the receive buffer 204 in the backup interface 250.

Similarly, the serial signal rxb transmitted by the transmit buffer 206 in the backup interface 250 at the E2 power-supply and ground levels is input to the first output buffer stage 541 in the second output buffer cell 540. The first output buffer stage 541 sends an identical serial signal at the E2 levels to the second output buffer stage 542, which outputs an equivalent serial signal at the E0 levels at I/O pad 543. This signal is carried through bonding wire W21 to the I/O pad 553 in the first input buffer cell 550 and received by the first input buffer stage 552, which sends an identical signal at the E0 levels to the second input buffer stage 551. The second input buffer stage 551 then sends an equivalent serial signal rxi to the read data register 104 in the power-down interface 150.

The power-down area 15 and backup area 25 are thus linked by serial data paths that cross voltage boundaries only in the buffer cells 530, 540, 550, 560 in the I/O area 50. The signal txi output by the power-down interface 150 at the E1 power-supply and ground levels is converted in the first output buffer cell 530 to the E0 power-supply and ground levels, carried to the second input buffer cell 560 over bonding wire W12, converted in the second input buffer cell 560 to the E2 power-supply and ground levels, and delivered at those levels to the backup interface 250 as signal txb. The signal rxb output by the backup interface 250 at the E2 power-supply and ground levels is converted in the second output buffer cell 540 to the E0 power-supply and ground levels, carried to the first input buffer cell 550 over bonding wire W21, converted in the first input buffer cell 550 to the E1 power-supply and ground levels, and delivered at those levels to the power-down interface 150 as signal rxi. The power-down interface 150 and backup interface 250 send and receive signals only at their own power supply levels, and neither interface is vulnerable to electrostatic destruction from surges occurring on the other interface's power supply.

Consequently, the chip 2 the second embodiment does not require ESD protection circuits in its core area 35. All ESD protection takes place in the I/O area 50. Moreover, even in the I/O area 50 it is not necessary to provide extra ESD protection circuits for the signal paths linking the power-down interface 150 with the backup interface 250, since these signal paths are protected by protection circuits already provided to ensure proper voltage relationships among the different power supplies.

In a variation of the second embodiment, the output buffer cells 530, 540 are connected to the input buffer cells 560, 550 by interconnecting wires disposed on the chip package or on a substrate on which the chip is mounted. Alternatively, the output buffer cells 530, 540 may be connected directly to the input buffer cells by metal-to-metal bonding.

In another variation of the second embodiment, each of the buffer cells 530, 540, 550, 560 includes a plurality of parallel I/O buffer circuits, and backup data are transferred by a parallel communication protocol in which each bit of data is transferred through one I/O buffer circuit.

For example, if there are eight I/O buffer circuits per buffer cell, eight bits of read or write data can be transferred in parallel. Control and address signals are multiplexed onto the same eight signal lines. Each I/O buffer circuit in the input and output buffers has to be connected separately to the power-down interface 150 or backup interface 250, but there is still no need for extra ESD protection circuits.

Third Embodiment

The third embodiment is generally similar to the second embodiment, but the serial signal paths between the power-down and backup voltage domains are routed on-chip through a pair of I/O buffer cells instead of being sent through external wires.

Figure 11:
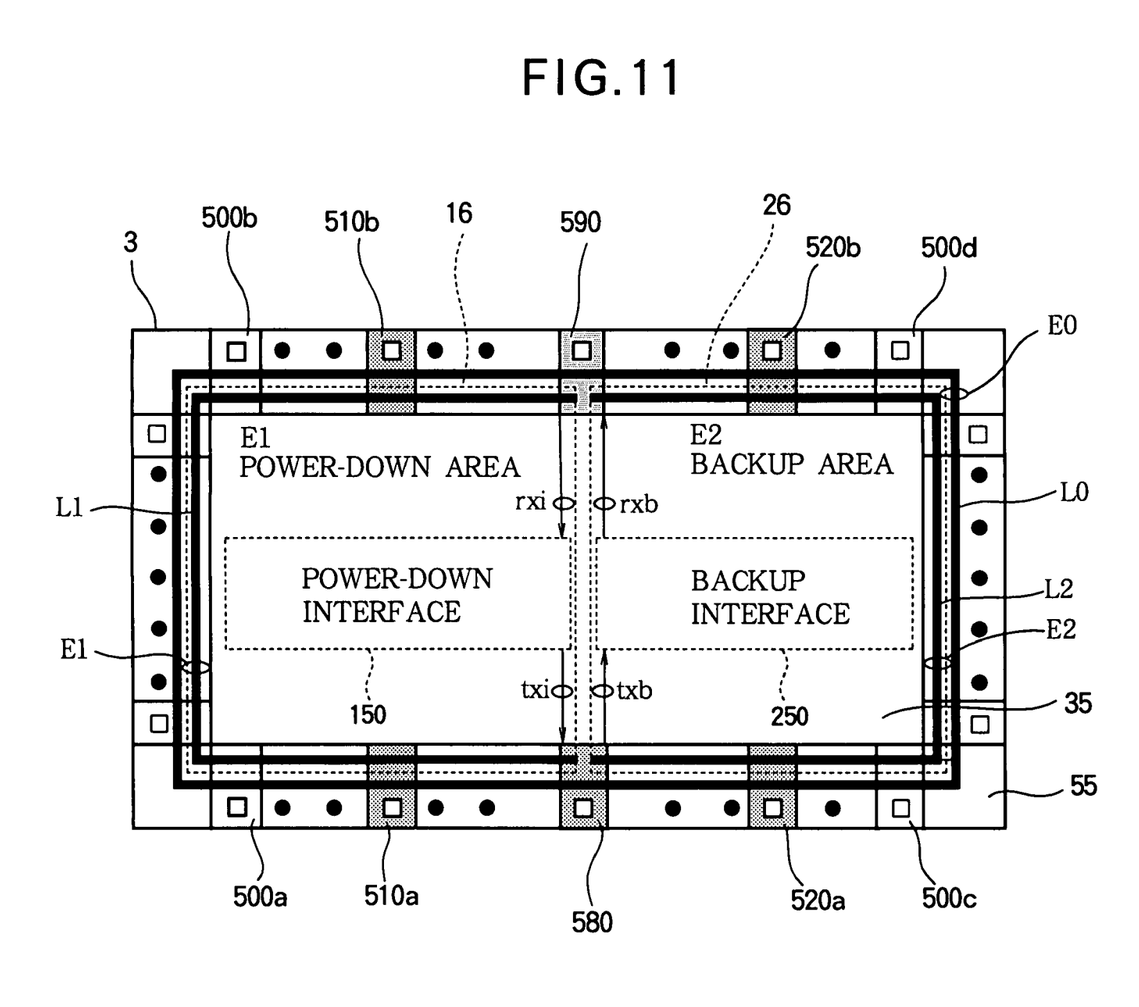
FIG. 11 is a schematic plan view of a semiconductor integrated circuit incorporating a third embodiment of the invention.

Referring to FIG. 11, the third embodiment is implemented in an LSI chip 3 having a power-down area 16 and a backup area 26 that constitute mainly the core area 35 of the chip but partly overlap the surrounding I/O area 55. The I/O area 55 is powered mainly by a power supply E0 furnished through four I/O power cells 500*a*, 500*b*, 500*c*, 500*d* and an I/O power line L0; the power-down area 16 is powered by a power supply E1 furnished through a pair of first core power cells 510*a*, 510*b* and a first core power line L1; the backup area 26 is powered by a power supply E2 furnished through a pair of second core power cells 520*a*, 520*b* and a second core power line L2. E1 and E2 power is also supplied to part of the I/O area 55.

The power-down area 16 and backup area 26 include a power-down interface 150 and a backup interface 250 which are connected to a pair of I/O buffer cells 580, 590 in the I/O area 55 by signal lines carrying the serial data signals txi, txb, rxb, rxi described in the second embodiment. Specifically, the power-down interface 150 sends serial data signal txi to the first I/O buffer cell 580 and receives serial data signal rxi from the second I/O buffer cell 590; the backup interface 250 sends serial data signal rxb to the second I/O buffer cell 590 and receives serial data signal txb from the first I/O buffer cell 580. The mixed-voltage interface in the third embodiment comprises the power-down interface 150, backup interface 250, and I/O buffer cells 580, 590.

Figure 12:
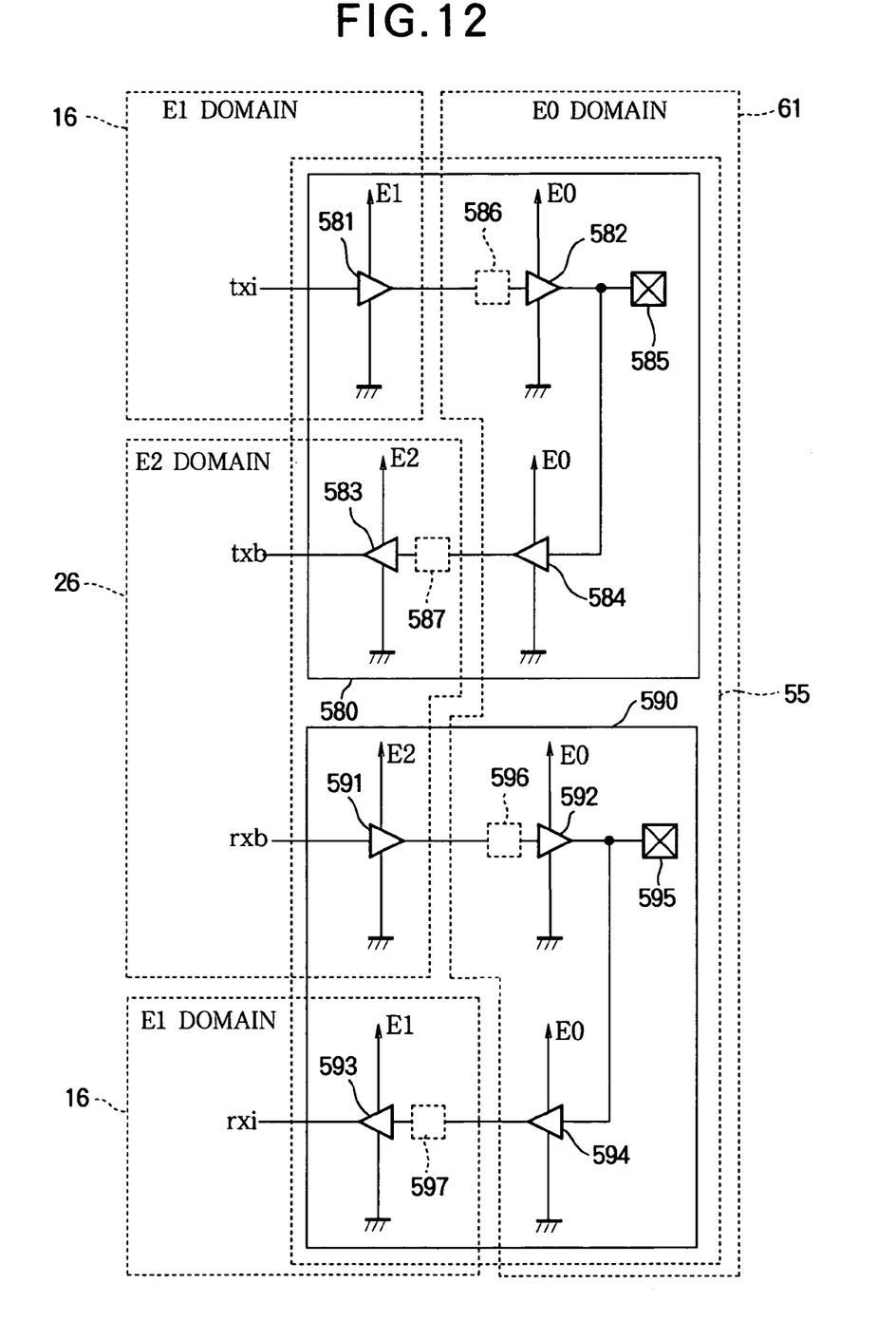
FIG. 12 is a schematic circuit diagram illustrating the input and output buffers in FIG. 11.

FIG. 12 shows the structure of I/O buffer cells 580, 590. Each of these I/O buffer cells straddles three voltage domains, being disposed partly in the E0 voltage domain 61 in the I/O area 55, partly in the E1 voltage domain (power-down area 16), and partly in the E2 voltage domain (backup area 26). The first I/O buffer cell 580 includes a first output buffer stage 581, a second output buffer stage 582, a second input buffer stage 583, a first input buffer stage 584, and an I/O pad 585; the second I/O buffer cell 590 includes a first output buffer stage 591, a second output buffer stage 592, a second input buffer stage 593, a first input buffer stage 594, and an I/O pad 595. The I/O pads 585, 595 are not used and may be omitted.

In the first I/O buffer cell 580, the first output buffer stage 581 operates at the E1 power-supply and ground potentials; the second output buffer stage 582 and first input buffer stage 584 operate at the E0 power-supply and ground potentials; the second input buffer stage 583 operates at the E2 power-supply and ground potentials.

In the second I/O buffer cell 590, the first output buffer stage 591 operates at the E2 power-supply and ground potentials; the second output buffer stage 592 and first input buffer stage 594 operate at the E0 power-supply and ground potentials; the second input buffer stage 593 operates at the E1 power-supply and ground potentials.

Accordingly, the first output buffer stage 581 and second input buffer stage 593 operate at the power-supply and ground potentials of the power-down area 16; the first output buffer stage 591 and second input buffer stage 583 operate at the power-supply and ground potentials of the backup area 26; and the second output buffer stage 582, first input buffer stage 584, second output buffer stage 592, and first input buffer stage 594 operate at the power-supply and ground potentials of the E0 voltage domain 61.

As in the second embodiment, the core power cells 510a, 510b, 520a, 520b include protection circuits (transistors, not shown) that can shunt current between the different power supplies to maintain proper voltage level relationships. These protection circuits also protect the signal lines that cross voltage boundaries in FIG. 12.

Specifically, in the first I/O buffer cell 580, the protection circuits in the first core power cells 510a, 510b function as an equivalent ESD protection circuit 586 to protect the signal line between the first output buffer stage 581 and second output buffer stage 582 by shunting current between power supplies E0 and E1 in case of a surge; the protection circuits in the second core power cells 520a, 520b function as an equivalent ESD protection circuit 587 to protect the signal line between the first input buffer stage 584 and second input buffer stage 583 by shunting current between power supplies E0 and E2 in case of a surge.

Similarly, in the second I/O buffer cell 590, the protection circuits in the second core power cells 520a, 520b function as an equivalent ESD protection circuit 596 to protect the signal line between the first output buffer stage 591 and second output buffer stage 592, and the protection circuits in the first core power cells 510a, 510b function as an equivalent ESD protection circuit 597 to protect the signal line between the first input buffer stage 594 and second input buffer stage 593.

The LSI chip 3 has a power-down mode similar to the power-down mode in the first and second embodiments. Data transfers between the power-down area 15 and backup area 26 are executed at entry to and exit from the power-down mode by the same backup and recovery routines as in the first embodiment (FIGS. 6 and 7).

To save data held in the power-down area 16, the power-down interface 150 sends a serial data signal txi to I/O buffer cell 580 in the I/O area 55, and I/O buffer cell 580 sends an equivalent serial data signal txb to the backup interface 250. To restore the saved data from the backup area 26 to the power-down area 16, the backup interface 250 sends a serial data signal rxb to I/O buffer cell 590 in the I/O area 55, and I/O buffer cell 590 sends an equivalent serial data signal rxi to the power-down interface 150.

More specifically, the serial signal txi is transmitted by the power-down interface 150 at the E1 power-supply and ground levels to the first output buffer stage 581 in the first I/O buffer cell 580. The first output buffer stage 581 sends an identical serial signal at the E1 levels to the second output buffer stage 582, which sends an equivalent serial signal at the E0 levels to the first input buffer stage 584. The first input buffer stage 584 sends an identical signal at the E0 levels to the second input buffer stage 583. The second input buffer stage 583 then sends an equivalent serial signal txb at the E2 levels to the backup interface 250.

Similarly, the serial signal rxb is transmitted by the backup interface 250 at the E2 power-supply and ground levels to the first output buffer stage 591 in the second I/O buffer cell 590. The first output buffer stage 591 sends an identical serial signal at the E2 levels to the second output buffer stage 592, which sends an equivalent serial signal at the E0 levels to the first input buffer stage 594. The first input buffer stage 594 sends an identical signal at the E0 levels to the second input buffer stage 593. The second input buffer stage 593 sends an equivalent serial signal rxi at the E1 levels to the power-down interface 150.

The serial data paths between the power-down area 16 and backup area 26 cross voltage boundaries only in these I/O buffer cells 580, 590 in the I/O area 55. The signal txi output by the power-down interface 150 at the E1 power-supply and ground levels is converted in the first I/O buffer cell 580 to the E0 power-supply and ground levels, then to the E2 power-supply and ground levels, and is delivered at those levels to the backup interface 250 as signal txb. The signal rxb output by the backup interface 250 at the E2 power-supply and ground levels is converted in the second I/O buffer cell 590 to the E0 power-supply and ground levels, then to the E1 power-supply and ground levels, and is delivered at those levels to the power-down interface 150 as signal rxi. The power-down interface 150 and backup interface 250 thus send and receive signals only at their own power supply levels, and neither interface is vulnerable to electrostatic destruction from surges occurring on the other interface's power supply.

Like the second embodiment, the third embodiment does not require ESD protection circuits in the core area 35 of the chip 3, and the protection circuits in the core power cells 510a, 510b, 520a, 520b in the I/O area 55 also protect the signal lines in I/O buffer cells 580, 590 from power-line surges, so it is not necessary to provide extra ESD protection for the signal paths linking the power-down interface 150 with the backup interface 250.

The two I/O buffer cells 580, 590 in the third embodiment replace a total of six cells (four buffer cells 530, 540, 550, 560, and two power isolation cells 570a, 570b) in the second embodiment. Besides saving space on the chip, the third embodiment requires four fewer external terminals than the second embodiment; alternatively, the third embodiment can make four more external terminals available for input and output of external signals.

The invention is not restricted to the preceding embodiments and the circuit configurations shown therein. A few variations have been mentioned above, but those skilled in the art will recognize that further variations are possible within the scope of the invention, which is defined in the appended claims.

What is claimed is:

1. A mixed-voltage interface for transferring a plurality of signals from a first circuit block operating at a first voltage level to a second circuit block operating at a second voltage level, different from the first voltage level, comprising:
- a signal line linking the first circuit block to the second circuit block;
- a first converter disposed in the first circuit block, for converting parallel data representing the plurality of signals to serial data;
- a transmitter for sending the serial data on the signal line from the first circuit block to the second circuit block;
- a receiver disposed in the second circuit block, for receiving the serial data from the signal line;
- a second converter for converting the received serial data to parallel data;
- an input buffer and an output buffer disposed on the signal line, the serial data being sent from the transmitter to the output buffer, from the output buffer to the input buffer, and from the input buffer to the receiver,
- wherein the output buffer includes a first output buffer stage operating at the first voltage level and a second output buffer stage operating at a third voltage level; and
- the input buffer includes a first input buffer stage operating at the third voltage level and a second input buffer stage operating at the second voltage level.

2. The mixed-voltage interface of claim 1, wherein the first voltage block and the second voltage block form part of a monolithic semiconductor integrated circuit and the mixed-voltage interface farther comprises a bonding wire, external to the monolithic semiconductor integrated circuit, connecting the second output buffer stage to the first input buffer stage.

3. The mixed-voltage interface of claim 1, further comprising:
- a first protection circuit for shunting current between the first and third voltage levels when one of the first and third voltage levels is abnormal; and
- a second protection circuit for shunting current between the second and third voltage levels when one of the second and third voltage levels is abnormal.

4. The mixed-voltage interface of claim 3, wherein the first voltage block and the second voltage block form part of a monolithic semiconductor integrated circuit having power cells for supplying the first, second, and third voltages, and the first and second protection circuits are disposed in the power cells.

5. A mixed-voltage interface for transferring a plurality of signals from a first circuit block operating at a first voltage level to a second circuit block operating at a second voltage level, different from the first voltage level, comprising:
- a signal line linking the first circuit block to the second circuit block;
- a first converter disposed in the first circuit block, for converting parallel data representing the plurality of signals to serial data;
- a transmitter for sending the serial data on the signal line from the first circuit block to the second circuit block;
- a receiver disposed in the second circuit block, for receiving the serial data from the signal line;
- a second converter for converting the received serial data to parallel data;
- an input/output buffer section disposed on the signal line, the serial data being sent from the transmitter through the input/output buffer section to the receiver,
- wherein the input/output buffer section comprises:
- a first output buffer stage operating at the first voltage level;
- a second output buffer stage operating at a third voltage level;
- a first input buffer stage operating at the third voltage level; and
- a second input buffer stage operating at the second voltage level;
- the serial data being sent from the transmitter to the first output buffer stage, from the first output buffer stage to the second output buffer stage, from the second output buffer stage to the first input buffer stage, from the first input buffer stage to the second input buffer stage, and from the second input buffer stage to the receiver.

6. The mixed-voltage interface of claim 5, further comprising:
- a first protection circuit for shunting current between the first and third voltage levels when one of the first and third voltage levels is abnormal; and
- a second protection circuit for shunting current between the second and third voltage levels when one of the second and third voltage levels is abnormal.

7. The mixed-voltage interface of claim 6, wherein the first voltage block and the second voltage block form part of a monolithic semiconductor integrated circuit having power cells for supplying the first, second, and third voltages, and the first and second protection circuits are disposed in the power cells.

* * * * *